United States Patent
Zhang et al.

(10) Patent No.: US 10,937,672 B2
(45) Date of Patent: Mar. 2, 2021

(54) HEATING DEVICE AND HEATING CHAMBER

(71) Applicant: BEIJING NAURA MICROELECTRONICS EQUIPMENT CO., LTD, Beijing (CN)

(72) Inventors: Jun Zhang, Beijing (CN); Xuewei Wu, Beijing (CN); Boyu Dong, Beijing (CN); Baogang Xu, Beijing (CN); Henan Zhang, Beijing (CN); Bingliang Guo, Beijing (CN); Wen Zhang, Beijing (CN); Shaohui Liu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 733 days.

(21) Appl. No.: 15/543,472

(22) PCT Filed: Dec. 30, 2015

(86) PCT No.: PCT/CN2015/099858
§ 371 (c)(1),
(2) Date: Jul. 13, 2017

(87) PCT Pub. No.: WO2017/059645
PCT Pub. Date: Apr. 13, 2017

(65) Prior Publication Data
US 2017/0365493 A1  Dec. 21, 2017

(30) Foreign Application Priority Data

Oct. 9, 2015  (CN) .......................... 201510648731.1
Dec. 10, 2015  (CN) .......................... 201510923022.X

(51) Int. Cl.
*H01L 21/67* (2006.01)
*C23C 14/54* (2006.01)
(Continued)

(52) U.S. Cl.
CPC ...... *H01L 21/67115* (2013.01); *C23C 14/541* (2013.01); *F27D 5/0037* (2013.01);
(Continued)

(58) Field of Classification Search
CPC ......... H01L 21/67115; H01L 21/67248; H01L 21/67103; H01L 21/67109;
(Continued)

(56) References Cited

U.S. PATENT DOCUMENTS 4,778,559 A  10/1988  McNeilly
5,239,614 A *  8/1993  Ueno ................ H01L 21/67115
392/416
(Continued)

FOREIGN PATENT DOCUMENTS

CN  1481582 A  3/2004
CN  2672082 Y  1/2005
(Continued)

OTHER PUBLICATIONS

The World Intellectual Property Organization (WIPO) International Search Report for PCT/CN2015/099858 dated Jul. 14, 2016 6 Pages.

*Primary Examiner* — Christopher M Koehler
*Assistant Examiner* — Chris Q Liu
(74) *Attorney, Agent, or Firm* — Anova Law Group, PLLC

(57) ABSTRACT

A heating device and a heating chamber are provided, comprising a base plate (21), at least three supporting columns (22) and a heating assembly, where the at least three supporting columns are arranged vertically on the base (Continued)

plate and are distributed at intervals along a circumferential direction of the base plate Top ends of the at least three supporting columns form a bearing surface for supporting a to-be-heated member (23). The heating assembly includes a heating light tube (24) and a thermal radiation shielding assembly, where the heating light tube is disposed above the base plate and below the bearing surface. A projection of an effective heating area formed by uniform distribution of the heating light tube on the base plate covers a projection of the bearing surface on the base plate. The thermal radiation shielding assembly shields heat radiated by the heating light tube towards surroundings and bottom.

18 Claims, 8 Drawing Sheets

(51) Int. Cl.
| | | |
|---|---|---|
| *H05B 1/02* | (2006.01) | |
| *H05B 3/00* | (2006.01) | |
| *F27D 19/00* | (2006.01) | |
| *F27D 5/00* | (2006.01) | |
| *C23C 14/35* | (2006.01) | |
| *F27D 3/00* | (2006.01) | |
| *H01L 21/687* | (2006.01) | |

(52) U.S. Cl.
CPC ..... *H01L 21/67248* (2013.01); *H05B 1/0233* (2013.01); *H05B 3/0047* (2013.01); *C23C 14/35* (2013.01); *F27D 2003/0065* (2013.01); *F27D 2019/0003* (2013.01); *H01L 21/67103* (2013.01); *H01L 21/68792* (2013.01)

(58) Field of Classification Search
CPC ......... H01L 21/67017; H01L 21/02164; H01L 21/02222; H01L 21/02238; H01L 21/02282; H01L 21/02326; H01L 21/02337; H01L 21/67098; H01L 21/68792; H01L 21/0262; H01L 21/26513; H01L 21/2686; H01L 21/324; H01L 21/6719; H01L 21/67288; H01L 21/67745; H01L 21/68742; H01L 21/68785; H01L 22/24; H05B 3/0047; H05B 1/0233; H05B 3/143
USPC ..... 392/416, 407, 411; 219/444.1, 385, 390, 219/392, 399, 405, 430, 439, 449.1, 491, 219/521, 530, 540; 118/720, 724, 725, 118/620, 641

See application file for complete search history.

(56) References Cited

U.S. PATENT DOCUMENTS

| | | | |
|---|---|---|---|
| 5,904,872 A * | 5/1999 | Arami | C23C 16/46 219/444.1 |
| 2004/0060513 A1* | 4/2004 | Kojima | H01L 21/6835 118/715 |
| 2009/0212037 A1 | 8/2009 | Ranish et al. | |
| 2013/0269614 A1* | 10/2013 | Zhao | C23C 16/46 118/725 |
| 2015/0147053 A1* | 5/2015 | Ranish | H05B 3/0047 392/411 |
| 2015/0226540 A1* | 8/2015 | Rajagopalan | G01B 11/0625 118/728 |
| 2015/0228528 A1* | 8/2015 | Behdjat | H01L 21/6875 219/392 |

FOREIGN PATENT DOCUMENTS

| | | |
|---|---|---|
| CN | 102808152 A | 12/2012 |
| CN | 103681182 A | 3/2014 |
| CN | 103811246 A | 5/2014 |
| CN | 104362076 A | 2/2015 |
| CN | 104465447 A | 3/2015 |
| CN | 104617008 A | 5/2015 |
| CN | 104362076 B | 4/2017 |
| CN | 104465447 B | 7/2017 |
| JP | S63108712 A | 5/1988 |
| JP | H01117033 A | 5/1989 |
| JP | H0297670 A | 4/1990 |
| JP | H05299350 A | 11/1993 |
| JP | H06224135 A | 8/1994 |
| JP | H10208855 A | 8/1998 |
| JP | 2001203195 A | 7/2001 |
| JP | 2002194539 A | 7/2002 |
| JP | 2003045806 A | 2/2003 |
| JP | 2003059788 A | 2/2003 |
| JP | 2010083683 A | 4/2010 |
| JP | 2014140042 A | 7/2014 |
| KR | 20090091650 A | 8/2009 |
| TW | 472291 B | 1/2002 |
| TW | 200943433 A | 10/2009 |
| WO | 2014199538 A1 | 12/2014 |

* cited by examiner

HEATING DEVICE AND HEATING CHAMBER

CROSS-REFERENCE TO RELATED APPLICATIONS

This application is a national phase entry under 35 U.S.C. § 371 of International Application No. PCT/CN2015/099858, filed on Dec. 30, 2015, which claims priority to and benefits of Chinese Patent Application Serial No. 201510648731.1, filed with the State Intellectual Property Office of P. R. China on Oct. 9, 2015, and claims priority to and benefits of Chinese Patent Application Serial No. 201510923022.X, filed with the State Intellectual Property Office of P.R. China on Dec. 10, 2015, the entire content of all of which is incorporated herein by reference.

FIELD OF THE DISCLOSURE

The present disclosure relates to the technical field of semiconductor device processing and, more particularly, relates to a heating device and a heating chamber.

BACKGROUND

As a common processing technology in the semiconductor field, the physical vapor deposition (PVD) technology such as a magnetron sputtering process is often performed in a vacuum chamber. Further, a heating device is disposed in the vacuum chamber. The heating device includes a base configured to bear a substrate, and a heating assembly. The heating assembly is configured to heat the substrate and later maintain temperature, such that the temperature needed by the sputtering process may be reached.

One existing heating device is an electrical resistance heater. An electrical resistance wire is disposed in the base, and the heat generated by the electrical resistance wire is transferred to the substrate through the base, thereby heating the substrate. In order to improve the thermal conduction efficiency and enhance heat uniformity, a back-blow pipe is further disposed in the base to supply an inert gas (e.g., argon) into the gap between the base and the substrate. Further, the electrical resistance heater further includes a thermocouple to detect the temperature of the base for the purpose of control.

The following issues inevitably exist in the practical application of the electrical resistance heater.

First, the heating efficiency of the electrical resistance heater is relatively low, and the temperature of the substrate rises slowly, thereby lowering the production efficiency. In particular, for a high temperature PVD process, after being transferred to a processing chamber, the substrate is required to be heated rapidly to and maintained at a temperature required by the process. After the process ends, the temperature of the substrate is expected to be decreased rapidly below a tolerable temperature of the robot arm, thereby ensuring that the robot arm may perform normal fetching and placing operations of the substrate. Thus, the existing electrical resistance heater fails to meet the requirement of fast heating and cooling for the high temperature PVD process.

Second, because the thermocouple acquires the temperature of the substrate indirectly by measuring the temperature of the base, and a difference (the difference is at least 100° C.) in temperature exists between the base and the substrate due to factors such as the thermal conduction efficiency, the accuracy of the temperature control of the substrate is relatively low.

To solve the aforementioned issues, often a heating bulb is utilized to assist the electrical resistance heater to heat the substrate in a thermal radiation manner. Specifically, FIG. 1 is a structural schematic diagram of an existing PVD apparatus. Referring to FIG. 1, the PVD apparatus includes a heating chamber 10, and a sealed quartz window 13 is disposed inside the heating chamber 10. The heating chamber 10 is divided into an upper sub-chamber and a lower sub-chamber by the sealed quartz window 13. A base 11 for bearing a substrate is disposed in the lower sub-chamber, and an electrical resistance wire 111 is disposed inside the base 11 to heat a substrate 14 disposed on the base 11. For the temperature of the substrate 14 to rise quickly and to improve the processing efficiency, heating bulbs 12 are disposed at the top of the upper sub-chamber, thereby heating the substrate 14 configured at a surface of the base 11 in a thermal radiation manner via the sealed quartz window 13. FIG. 2 is a cross-sectional view along line A-A of FIG. 1, and as shown in FIG. 2, the heating bulbs 12 are arranged along a circumferential direction of the heating chamber 10.

In practical applications, the aforementioned heating device inevitably has the following issues.

First, because the heating bulbs 12 can only be used in an atmospheric environment, the heating bulbs 12 may only use a top-heating mode. That is, thermal radiation is performed from above the substrate. Such heating method has a small application range. For example, such heating method may not be applied to a magnetron sputtering chamber having a target material at the top thereof.

Second, because the heating bulbs 12 can only be used in an atmospheric environment, the heat loss is relatively high, which is particularly significant when high temperature heating (above 500° C.) is performed. Accordingly, the heating efficiency is relatively low and high-temperature heating cannot be maintained. Further, the heating bulbs 12 have to heat the substrate 14 indirectly via the sealed quartz window 13, resulting in heat loss. Such step further reduces the heating efficiency.

BRIEF SUMMARY OF THE DISCLOSURE

To address the aforementioned technical issues, the present disclosure provides an improved heating device and a heating chamber. The heating device and heating chamber not only have a relatively high heating efficiency, but may also be applied in a vacuum environment or an atmospheric environment, thereby expanding the application range.

A technical solution adopted to address the aforementioned technical issues is to provide a heating device. The heating device including a base plate, at least three supporting columns and a heating assembly. The at least three supporting columns are arranged vertically on the base plate and are distributed at intervals along a circumferential direction of the base plate. Further, top ends of the at least three supporting columns form a bearing surface for supporting a to-be-heated member. The heating assembly includes a heating light tube and a thermal radiation shielding assembly, where the heating light tube is disposed above the base plate and located below the bearing surface and is configured to radiate heat towards the bearing surface. Further, a projection of an effective heating area formed by the uniform distribution of the heating light tube on the base plate covers a projection of the bearing surface on the base plate. The thermal radiation shielding assembly is configured to shield the heat radiated by the heating light tube towards the surroundings and the bottom of the heating light tube.

Preferably, the heating light tube includes a heating section, and two non-heating sections located at two ends of the heating section. A heating wire configured to generate heat is disposed in the heating section, and an area where the heating wire is located is the effective heating area. Conductive wires respectively connected to two ends of the heating wire are disposed in each non-heating section and serve as positive and negative electrodes of the heating light tube.

Preferably, a shape and size of the effective heating area are obtained by configuring a shape of the heating light tube and a length of the heating wire.

Preferably, a shape of the effective heating area corresponds to a shape of the bearing surface.

Preferably, the number of the heating light tubes is plural. The plurality of heating light tubes may each be a straight tube, and are arranged in parallel to each other at equal intervals. Or, each heating light tube includes an arc-shaped portion and straight-line portions connected to two ends of the arc-shaped portion. The arc-shaped portions of the heating light tubes are concentric, have different radii, and are arranged at equal intervals. The straight-line portions of the heating light tubes are arranged in parallel to each other at equal intervals.

Preferably, the heating light tubes are divided into a plurality of heating groups based on different areas of the bearing surface. Further, the heating light tubes in a same heating group are electrically connected, and the heating light tubes in different heating groups are shielded from each other.

Preferably, the heating device further includes a heating control system, and the heating control system includes a temperature detector, a temperature controller, an adjustment controller and a plurality of power controllers. The temperature detector is configured to detect a real-time temperature at any position of the to-be-heated member in an execution stage of the heating process and transmit the real-time temperature to the temperature controller. The temperature controller is configured to generate a control signal based on the real-time temperature transmitted from the temperature detector and a preset target temperature, and send the control signal to the adjustment controller. The adjustment controller is configured to respectively obtain a plurality of control sub-signals corresponding to the heating groups based on the control signal and a heating weighting function, and send the control sub-signals to the power controllers in a one-to-one correspondence. The number of the power controllers corresponds to the number of the heating groups, and each power controller is configured to adjust the heating power of the heating light tubes in the heating group corresponding to the power controller based on the control sub-signal.

Preferably, the heating weighting function is established in a preset stage by trial and error based on a temperature distribution of the to-be-heated member.

Preferably, the heating weighting function is:

if $T\text{meas} < Tp-T, Un=U$;

if $T\text{meas} \geq Tp-T, Un=fn(U)=knU+b$;

where n is an integer larger than 0 and smaller than or equal to N, and N is the number of the heating groups;

$T\text{meas}$ is the real-time temperature detected by the temperature detector;

Un represents the control sub-signal corresponding to an $n^{th}$ heating group;

U represents the control signal;

fn (U) represents a preset correspondence rule corresponding to the $n^{th}$ heating group;

Tp is the preset target temperature;

T is a preset threshold temperature;

kn is a weighting coefficient corresponding to the $n^{th}$ heating group; and b is a constant.

Preferably, in the preset stage, during the process of establishing the heating weighting function, temperature detection points are configured in areas of the bearing surface where the heating groups are located in a one-to-one correspondence; and during a detection process, the real-time temperature of each temperature detection point is detected. If the real-time temperature detected at any one of the temperature detection points is close to the preset target temperature, the temperature distribution condition of the to-be-heated member is obtained based on the real-time temperature of each temperature detection point detected at a current moment. Further, the heating weighting function is established based on the temperature distribution condition, such that the difference in temperature between different areas of the to-be-heated member satisfies the requirement of a process on temperature uniformity.

Preferably, among the at least three supporting columns, at least one supporting column is used as the thermocouple of the temperature detector, and each thermocouple is located in the areas of the bearing surface where the heating groups are located in a one-to-one correspondence.

Preferably, the number of the heating light tube is one, and the one heating light tube is a planar spiral tube with equal intervals.

Preferably, the thermal radiation shielding assembly includes a first shielding member including a first horizontal part and a first vertical part. The first horizontal part is located below the heating light tube and covers the effective heating area. The first vertical part is connected to the first horizontal part and surrounds the heating section of the heating light tube. Further, a top end of the first vertical part is higher than the heating light tube. The thermal radiation shielding assembly further comprises a second shielding member including a second horizontal part and a second vertical part. The second vertical part surrounds the bearing surface, and the top end of the second vertical part is higher than the bearing surface. The second horizontal part surrounds an outer side of the second vertical part, and a plane where the second horizontal part is located is higher than the first vertical part and the heating light tube.

Preferably, the number of the first shielding members is plural, and the first vertical parts of the first shielding members are arranged at intervals along a direction parallel to the bearing surface. The first horizontal parts of the first shielding members are arranged at intervals along a direction perpendicular to the bearing surface.

Preferably, surfaces of the first horizontal part, the first vertical part, the second horizontal part and the second vertical part facing towards the heating light tube are respectively polished or plated to improve light reflectivity.

Preferably, surfaces of the first horizontal part, the first vertical part, the second horizontal part and the second vertical part facing towards the heating light tube include planar surfaces or curved surfaces.

Preferably, materials of the first shielding member and the second shielding member include molybdenum, stainless steel or quartz.

Preferably, the heating device further includes two electrodes disposed on the base plate that are close to a central position of the base plate. The upper and lower ends of the electrodes are located above and below the base plate, respectively. The heating device further includes two electric connectors located between the thermal radiation shielding assembly and the base plate. One end of each electric connector is respectively and electrically connected to each electrode, and the other end of each electric connector is electrically connected to the heating light tube.

Preferably, the heating device further includes: a first electric shielding member surroundingly located on the base plate and has a first closed space to shield the electric fields generated at the connecting portion between the electric connectors and the light heating tube; and a second electric shielding member that covers the connecting portion between the electrodes and the electric connectors to form a second closed space, and is configured to respectively shield the electric fields generated at the connecting portions between the electrodes and the electric connectors.

Preferably, the heating light tube is a short-wave infrared light tube.

Preferably, a cooling channel is disposed in the based plate to cool the base plate by introducing cooling water into the cooling channel.

As another technical solution, the present disclosure further provides a heating chamber including a heating device and a driving device for driving the heating device to move up and down. The heating device uses the aforementioned heating device according to the present disclosure.

Preferably, the driving device includes a first lifting shaft and a first driving mechanism. The first lifting shaft is vertically arranged, an upper end of the first lifting shaft is connected to the base plate, and a lower end of the first lifting shaft extends vertically and downwards to be outside of the heating chamber. The first driving mechanism is disposed at the bottom of the heating chamber, connected to the first lifting shaft, and is configured to drive the base plate to move up or down through the first lifting shaft.

Preferably, the driving device further includes at least three movable supporting columns, a connector, a second lifting shaft, and a second driving mechanism. The at least three movable supporting columns are vertically arranged on the connector and are distributed along a circumferential direction of the base plate at intervals, and top ends of the at least three movable supporting columns are configured to support the to-be-heated member. The second lifting shaft is vertically arranged, an upper end of the second lifting shaft is connected to the connector, and a lower end of the second lifting shaft extends vertically and downwards to be outside of the heating chamber. The second driving mechanism is disposed at the bottom of the heating chamber and connected to the second lifting shaft, and is configured to drive the movable supporting columns to move up or down through the second lifting shaft.

The present disclosure has the following advantageous effects.

The heating device provided by the present disclosure may reduce the heat loss of the heating light tube by using the heating light tube disposed below the to-be-heated member to directly radiate heat upwards and using the thermal radiation shielding assembly to shield heat radiated by the heating light tube towards the surroundings and bottom, thereby improving the heating efficiency. Further, the requirements of the high temperature PVD process on fast heating, high temperature preservation and fast cooling of a substrate may be satisfied. Further, the heating device provided by the present disclosure may not only be applied to a vacuum environment or an atmospheric environment directly, but may have a relatively large application range. Further, the heat loss of the heating tube in the vacuum environment may be less, thereby further improving the heating efficiency.

By using the aforementioned heating device, the heating chamber provided by the present disclosure not only has a relatively high heating efficiency, but may also be applied to a vacuum environment or an atmospheric environment, thereby expanding the application range.

DETAILED DESCRIPTION

To make the objects, technical solutions and advantages of the present disclosure clearer, a heating device and a heating chamber provided by the present disclosure will be described below in conjunction with the accompanying drawings. It should be understood that, specific embodiments described herein are merely used for explaining the present disclosure, rather than limiting the present disclosure.

Figure 1:
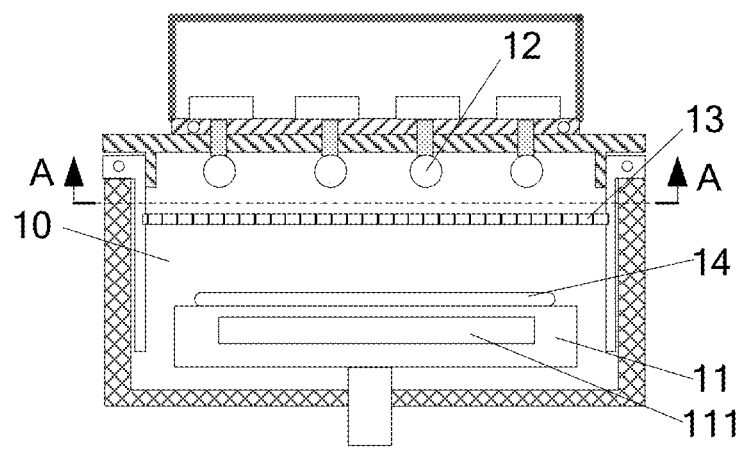
FIG. 1 is a structural schematic diagram of an existing heating chamber in a PVD apparatus.
Figure 2:
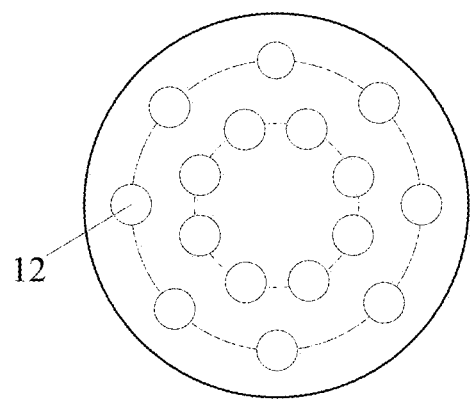
FIG. 2 is an A-A cross-sectional view of FIG. 1.
Figure 3:
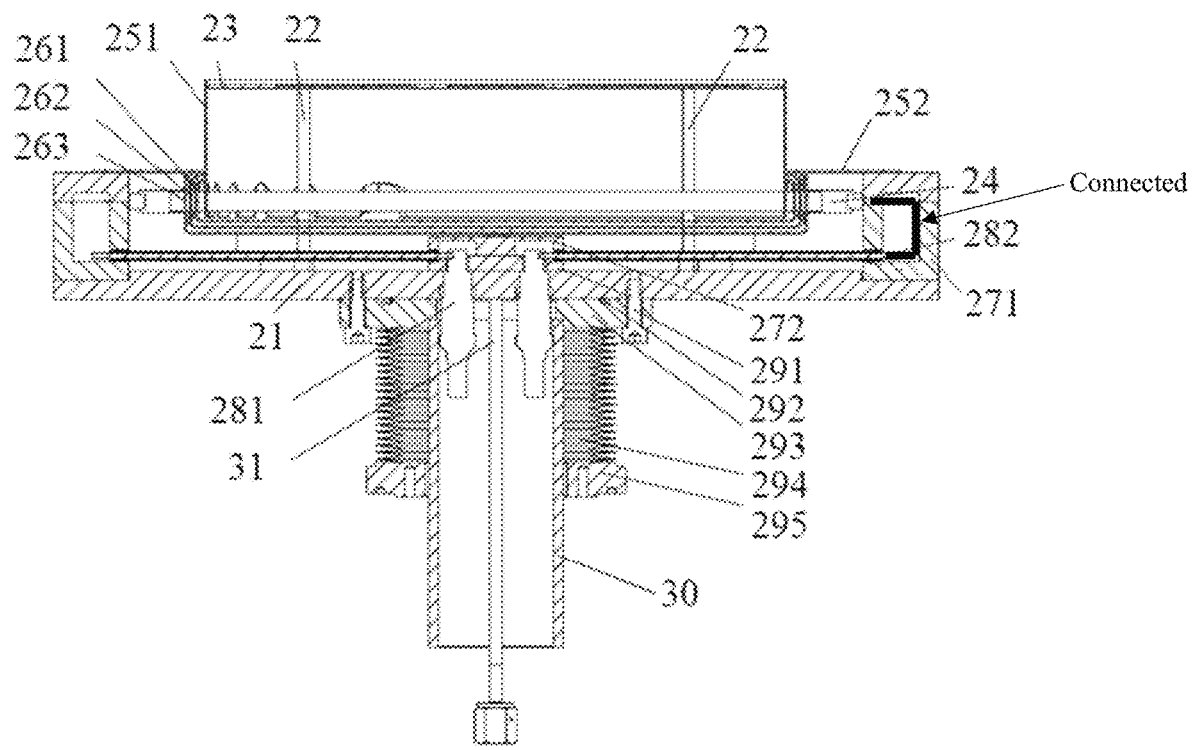
FIG. 3 is a cross-sectional view of a heating device according to embodiments of the present disclosure.

FIG. 3 is a cross-sectional view of a heating device provided by embodiments of the present disclosure. Referring to FIG. 3, the heating device is configured to heat a to-be-heated member 23 using a thermal radiation manner. The to-be-heated member 23 may be a single substrate or a tray for bearing a plurality of substrates. The heating device includes a base plate 21, three supporting columns 22, and a heating assembly. The three supporting columns 22 are arranged vertically on the base plate 21 and are distributed at intervals along the circumferential direction of the base plate 21. The top ends of the three supporting columns 22 form a bearing surface for supporting the to-be-heated member 23. The shape and the area of the bearing surface may be considered as the shape and the area of an orthogonal projection of the to-be-heated member 23 that is placed on the top ends of the three supporting columns 22 on the base plate 21. The heating assembly includes a heating light tube 24 and a thermal radiation shielding assembly. The heating light tube 24 is disposed on the base plate 21 and located below the bearing surface, namely, located below the top ends of the three supporting columns 22, to radiate heat towards the bearing surface, such that the to-be-heated member 23 may be heated in a lower-heating mode. Such heating mode may be applied to a magnetron sputtering chamber having a target material at the top thereof and may also be applied to a vacuum environment or an atmospheric environment. Accordingly, not only the application range becomes relatively wide, but the heat loss of the heating light tube in the vacuum environment turns out to be less, thereby further improving the heating efficiency.

Figure 4A:
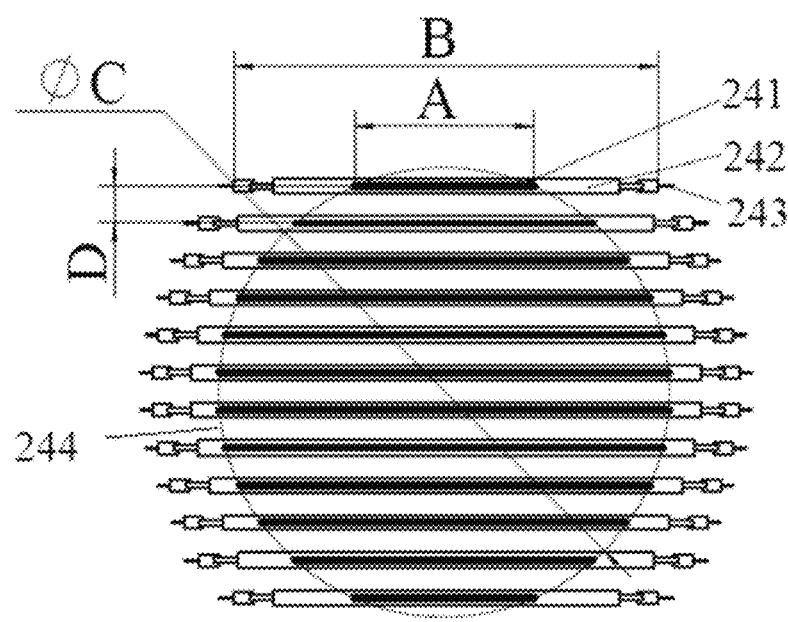
FIG. 4A is an arrangement diagram of heating light tubes used in embodiments of the present disclosure.

FIG. 4A is an arrangement diagram of heating light tubes used in embodiments of the present disclosure. Referring to FIG. 4A, in one embodiment, a plurality of heating light tubes 24 are used, and the plurality of heating light tubes 24 are each a straight tube and are arranged in parallel to each other at equal intervals. Further, a projection of an effective heating area 244 formed by uniform distribution of the heating light tubes 24 on the base plate 21 covers a projection of the bearing surface on the base plate 21, such that the to-be-heated member 23 disposed on the top ends of supporting columns 22 may be uniformly heated by the plurality of heating light tubes 24. Accordingly, the temperature uniformity of the to-be-heated member may be improved. Further, the configuration method of the effective heating area 244 of the aforementioned heating light tubes 24 allows each heating light tube 24 to include a heating section 241 and two non-heating sections 242 located at two ends of the heating section 241. That is, a middle section of the light heating tube 24 is a heating section 241, and two edge sections of the light heating tube 24 are the non-heating sections 242. A heating wire for generating the heat is disposed in the heating section 241, and a length A of the heating wire is smaller than a total length B of the heating light tube 24. Because the heating wire is a heating source capable of radiating heat, an area where the heating wires are located is then the effective heating area 244. Further, conductive wires respectively connected to two ends of the heating wire are disposed in each non-heating section 242 and serve as positive and negative electrodes of a heating light tube 24.

Further, a shape and size of the effective heating area 244 may be obtained by configuring a shape of each heating light tube 24 and a length of each heating wire. Preferably, the shape of the effective heating area 244 corresponds to a shape of the aforementioned bearing surface. For example, in one embodiment, as shown in FIG. 4A, an orthogonal projection of the to-be-heated member 23 that is placed on the top ends of the supporting columns 22 on the base plate 21 is in the shape of a circle. That is, an orthogonal projection of the bearing surface on the base plate 21 is in the shape of a circle. Under such situation, a shape simultaneously formed by the heating wires in each heating light tube 24 is also a circle. Specifically, the length of each heating wire reduces gradually from a central area of the bearing surface to marginal areas at two sides of the central area, and a circle may be obtained by connecting end points of each heating wire subsequently, thereby forming the effective heating area 244 having a circular shape. In practical applications, a diameter C of the effective heating area 244 may be larger than a diameter of the to-be-heated member 23 to ensure that a projection of the effective heating area 244 on the base plate 21 covers the diameter of the bearing surface on the base plate 21. Further, the distance D between two adjacent heating light tubes 24 may be arbitrarily configured based on specific conditions.

Preferably, the heating light tube is a short-wave infrared light tube. Because the power of the short-wave radiation is larger than that of medium-wave or long-wave radiation, and the thermal energy of the short-wave infrared light tube is mainly distributed in a region where the wavelength is smaller than 2 μm (62.5% of the thermal energy), an object may be heated quickly. Accordingly, light emitted by the short-wave infrared light tube may traverse the surface of the to-be-heated member 23, thereby further realizing rapid heating of the to-be-heated member 23.

Figure 4B:
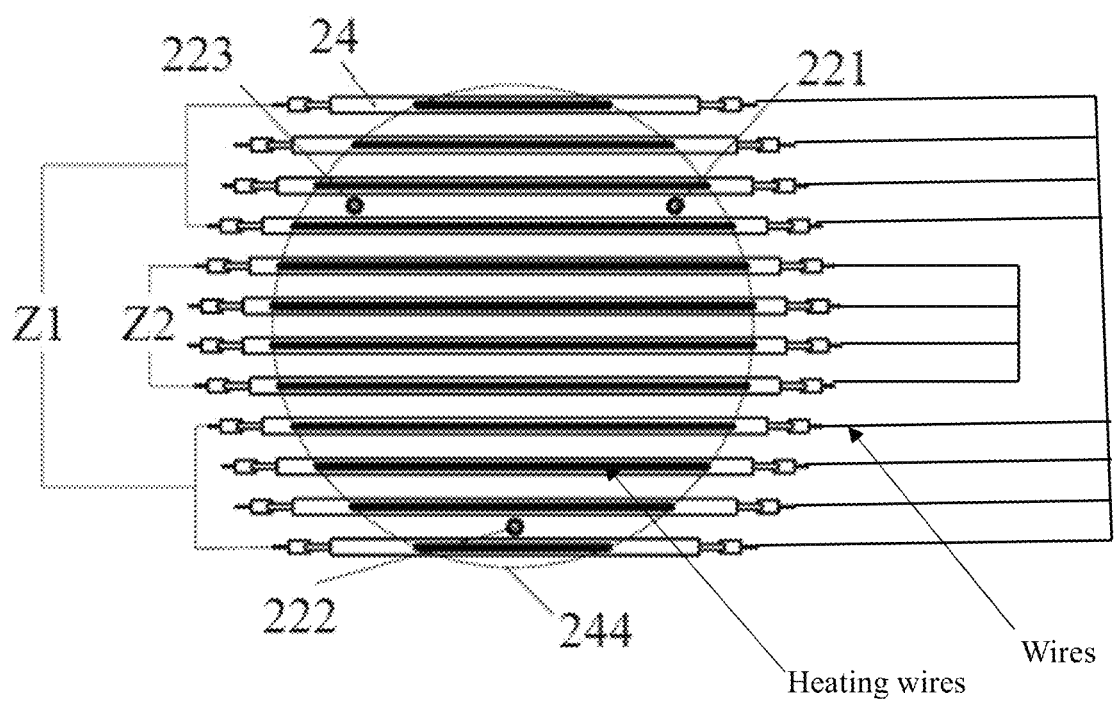
FIG. 4B is a partition arrangement diagram of heating light tubes used in embodiments of the present disclosure.

Further and preferably, the plurality of heating light tubes 24 are divided into a plurality of heating groups based on different areas of the bearing surface. Further, the heating light tubes 24 in a same heating group are electrically connected, and the heating light tubes 24 in different heating groups are shielded from each other. Specifically, FIG. 4B is a partition arrangement diagram of heating light tubes used in embodiments of the present disclosure. Referring to FIG. 4B, the plurality of heating light tubes 24 are divided into two heating groups (Z2, Z1) based on a central area of the bearing surface and marginal areas at two sides of the central area. In each heating group, the heating light tubes 24 are electrically connected through conductive wires, and different heating groups are shielded from each other. Accordingly, the heating powers of the heating light tubes 24 in the two heating groups may be individually and respectively controlled, such that partition adjustment of the temperatures of the central area and the marginal areas of the to-be-heated member 23 may be realized. Thus, the difference in temperature between the central area and the marginal areas may be reduced, and the temperature uniformity of the to-be-heated member 23 may be further improved.

Figure 4C:
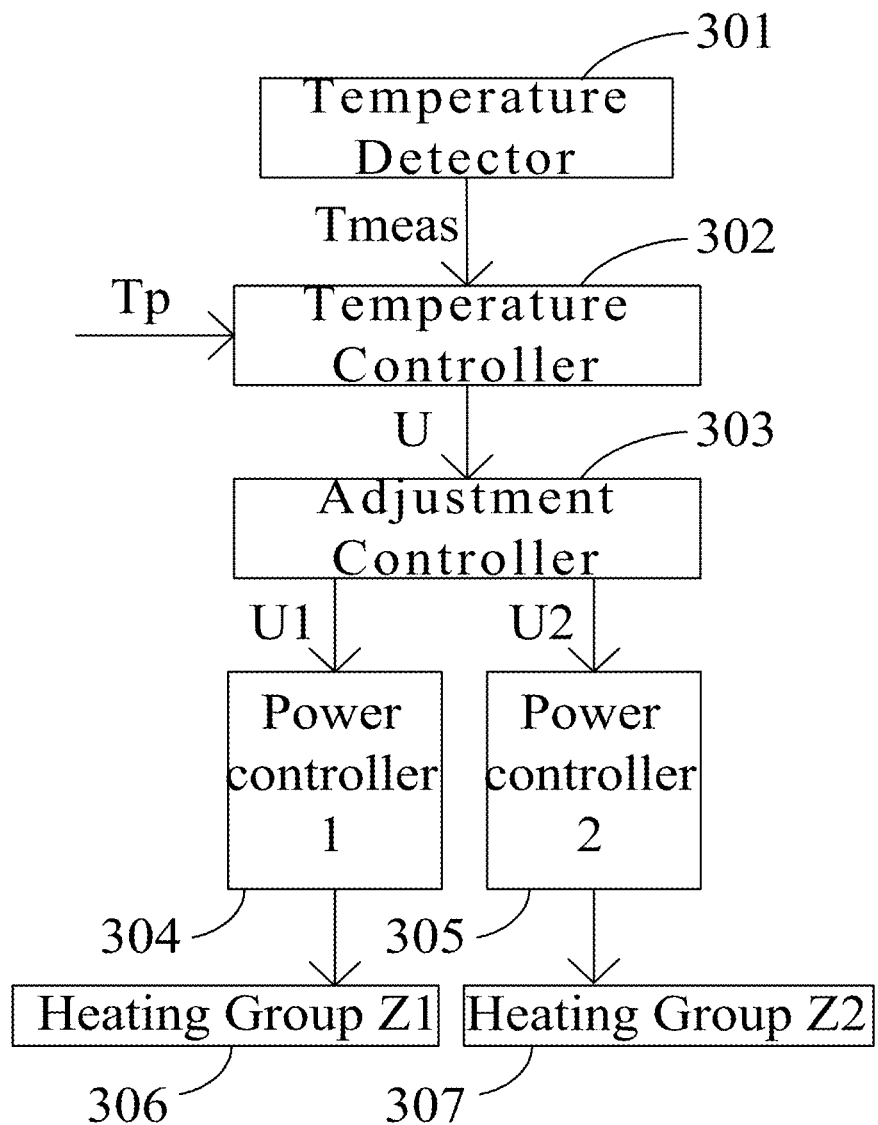
FIG. 4C is a principle block diagram of a heating control system used in embodiments of the present disclosure.

Further, a heating control system may be used to individually control the temperatures of the central area and the marginal areas of the to-be-heated member 23. Specifically, FIG. 4C is a principle block diagram of a heating control system used in embodiments of the present disclosure. Referring to FIG. 4C, the heating control system includes a temperature detector 301, a temperature controller 302, an adjustment controller 303, and two power controllers (304, 305). The temperature detector 301 is configured to detect a real-time temperature at any position of the to-be-heated member 23 in an execution stage of the heating process and send the real-time temperature to the temperature controller 302. The temperature controller 302 is configured to generate a control signal U based on the real-time temperature Tmeas sent from the temperature detector 301 and a preset target temperature Tp, and send the control signal U to the adjustment controller 303. The preset target temperature Tp is a temperature of the to-be-heated member required by the process. The adjustment controller 303 is configured to obtain two control sub-signals (U1, U2) respectively corresponding to the two heating groups (Z1, Z2) based on the control signal U and a heating weighting function. Further, the adjustment controller 303 send the control sub-signal U1 to the first power controller 304 and send the control sub-signal U2 to the second power controller 305. The first power controller 304 is configured to adjust the heating power of the heating light tubes in the heating group Z1 based on the control sub-signal U1, thereby realizing temperature adjustment of the marginal areas of the to-be-heated member 23. The second power controller 305 is configured to adjust the heating power of the heating light tubes in the heating group Z2 based on the control sub-signal U2, thereby realizing temperature adjustment of the central area of the to-be-heated member 23.

Accordingly, individual control of the temperatures of the central and marginal areas of the to-be-heated member may be realized, such that the requirements of the temperature uniformity of the to-be-heated member may be satisfied. Further, by detecting the real-time temperature at any position of the to-be-heated member 23 using a single temperature detector 301 in the execution stage of the heating process, namely, by using a single temperature detection point, partition control of the temperature of the to-be-heated member 23 may be realized. Accordingly, given that the temperature uniformity of the to-be-heated member is improved, issues of apparatus design and an increase in difficulty of installation due to the introduction of a plurality of temperature detection points may be avoided. Further, the leakage possibility of the vacuum chamber may also be reduced, thereby lowering the risk of affecting the quality of film deposition.

Further, as shown in FIG. 4B, the three supporting columns 22 may be respectively a first supporting column 221, a second supporting column 222 and a third supporting column 223. One of the supporting columns 22 may be used as a thermocouple of the temperature detector 301. For example, the second supporting column 222 may be used as the thermocouple of the temperature detector 301 and may be disposed in an area where the heating group Z1 is located. The second supporting column 222 may have both functions of supporting and temperature detection, such that not only the structure of the heating device may be simplified, but also the temperature of the to-be-heated member 23 may be obtained more accurately because the thermocouple may be in direct contact with the to-be-heated member 23, thereby improving the accuracy of temperature control. Obviously, in practical applications, the temperature detector may be a non-contact sensor such as an infrared sensor.

The aforementioned heating weighting function satisfies that: heating powers of the heating light tubes in each heating group may be balanced to realize the objective of reducing the temperature difference between the central area and the marginal areas of the to-be-heated member 23 and improving the temperature uniformity of the to-be-heated member 23. More specifically, the heating weighting function may be as follows: if Tmeas<Tp−T, Un=U, and if Tmeas≥Tp−T, Un=fn (U)=knU+b, where n is an integer larger than 0 and is smaller than or equal to N, and N is the number of the heating groups. Further, Tmeas is the real-time temperature detected by the temperature detector, Un represents the control sub-signal corresponding to an $n^{th}$ heating group, and U represents the control signal. Further, fn (U) represents a preset correspondence rule corresponding to the $n^{th}$ heating group, Tp is the preset target temperature, T is a preset threshold temperature, kn is a weighting coefficient corresponding to the $n^{th}$ heating group, and b is a constant.

Figure 4D:
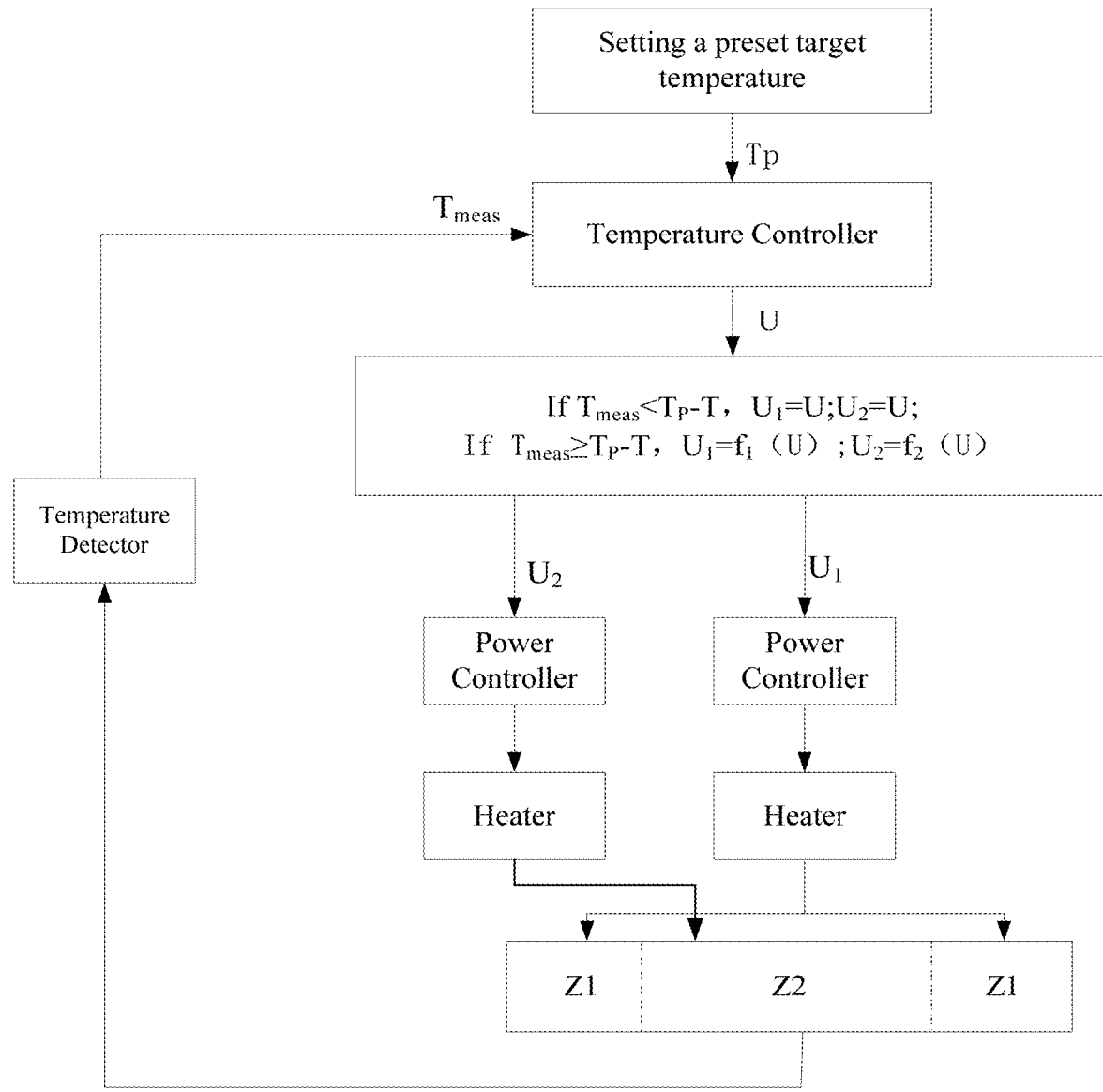
FIG. 4D is a flow block diagram of a heating control system used in embodiments of the present disclosure.

FIG. 4D is a flow block diagram of a heating control system used in embodiments of the present disclosure. Referring to FIG. 4D, T is assumed to be 50° C. If Tmeas<Tp−50° C., Un=U. As such, in a heating stage during which the real-time temperature of the to-be-heated member is increased to Tp−50° C., each power controller adjusts the heating powers of the heating light tubes in the heating groups (Z1, Z2) respectively under the control of the control sub-signal Un=U, thereby ensuring the heating rate. If Tmeas≥Tp−50° C., Un=fn (U)=knU+b, namely, U1=f1(U)=k1U+b, and U2=f2(U)=k2U+b. As such, when the real-time temperature of the to-be-heated member is close to the process temperature, the first power controller adjusts the heating power of the heating light tubes in the first heating group Z1 under the control of the control sub-signal U1=f1 (U)=k1U+b. Further, the second power controller adjusts the heating power of the heating light tubes in the second heating group Z2 under the control of the control sub-signal U2=f2(U)=k2U+b. Accordingly, the temperature of the to-be-heated member may be maintained within a heat preservation stage of Tp−50° C., thereby ensuring that the temperature uniformity requirement of the to-be-heated member is satisfied.

From the aforementioned descriptions, by using the aforementioned piecewise function as the heating weighting function, not only the temperature uniformity requirement on the to-be-heated member may be satisfied in the heat preservation stage, but also the heating rate may be ensured in the heating stage. Accordingly, the processing time may be reduced, and the processing efficiency may be improved.

Preferably, the heating weighting function may be established by using a following method: the heating weighting function is established in a preset stage by a method of trial and error based on a temperature distribution condition of the to-be-heated member. For example, in the process of establishing the heating weighting function, in the preset stage, temperature detection points are disposed, in a one-to-one correspondence, in the areas of the bearing surface that is configured to support the to-be-heated member where the heating groups are located. In a detection process, the real-time temperature of each temperature detection point is detected. If the real-time temperature detected at any one of the temperature detection points is close to the preset target temperature, the temperature distribution condition of the to-be-heated member is obtained based on the real-time temperatures detected by the temperature detection points at a current moment. Further, the heating weighting function is established based on the temperature distribution condition, such that the difference in temperature between different areas of the to-be-heated member may satisfy the requirements of the process on temperature uniformity. In practical application, a plurality of thermocouples or infrared sensors may be used to detect, in a one-to-one correspondence, the real-time temperatures of the to-be-heated member at each temperature detection point.

Hereinafter, a specific implementation method of establishing the heating weighting function is described in detail. For example, the partition method of the heating light tubes may be as follows: the plurality of heating light tubes are divided into three heating groups (Z1-Z3), namely, a central area Z1 of the bearing surface of the to-be-heated member, two intermediate areas Z2 at two sides of the central area Z1, and two marginal areas Z3 located respectively at outer sides of the two intermediate areas Z2. Correspondingly, three temperature detection points are configured, and the three temperature detection points are located in the central area Z1, the intermediate area Z2 and the marginal area Z3, respectively.

Figure 4E:
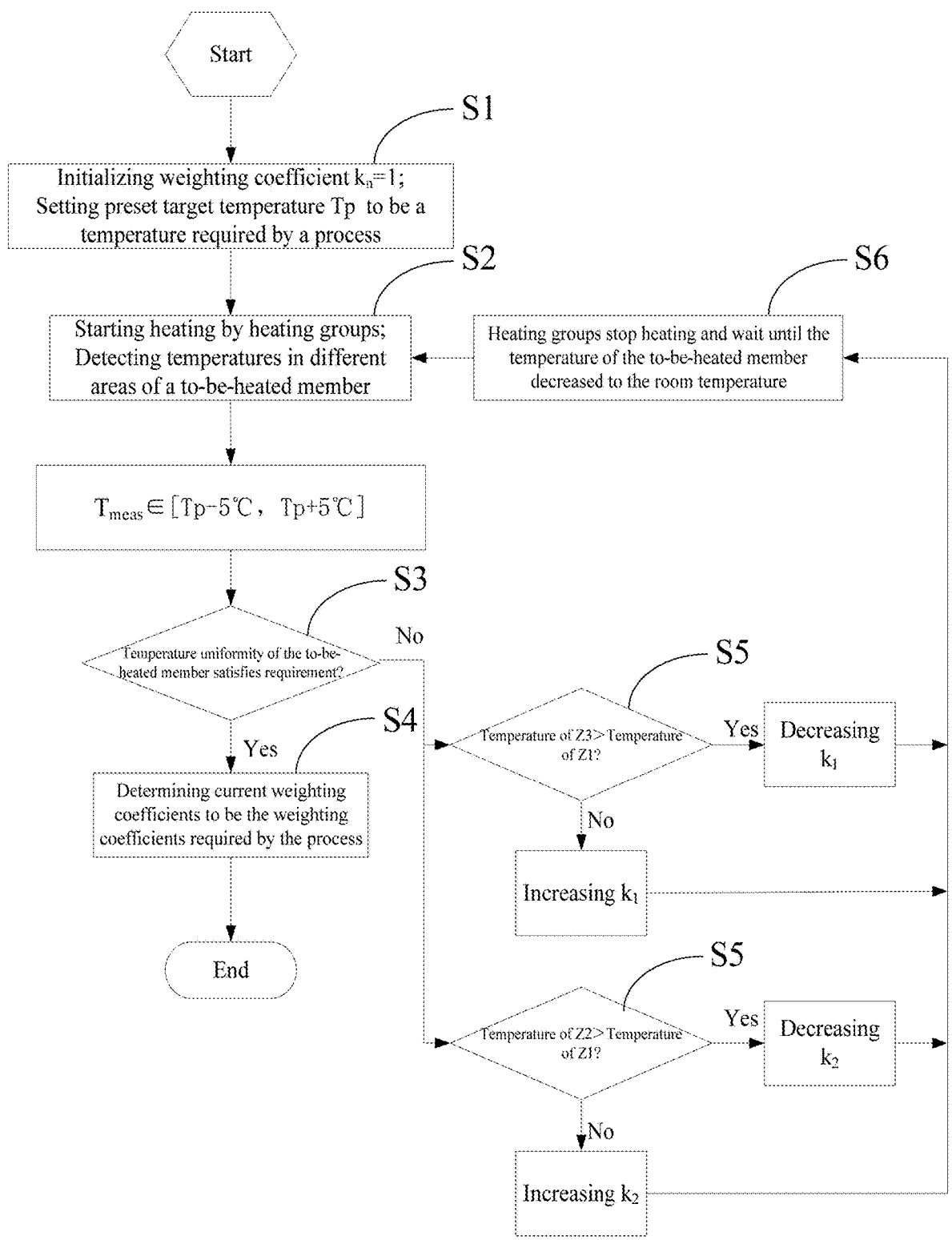
FIG. 4E is a flow block diagram of establishing a heating weighting function according to embodiments of the present disclosure.

FIG. 4E is a flow block diagram of establishing a heating weighting function according to embodiments of the present disclosure. Referring to FIG. 4E, the heating weighting function is established through the following steps.

At step S1, the weighting coefficient kn is initialized to be 1, that is, the heating weighting function is initialized to be U1=U, U2=U, and U3=U; and a preset target temperature Tp is set to be a temperature required by a process.

At step S2, each of the heating groups starts to heat, and simultaneously, the real-time temperatures Tmeas of the temperature detection points in the central area Z1, the intermediate area Z2 and the marginal area Z3 of the to-be-heated member are respectively detected and sent to the temperature controller.

At step S3, the temperature controller determines whether the temperature uniformity of the to-be-heated member satisfies the requirement when the real-time temperature Tmeas detected at any temperature detection point is close to the preset target temperature Tp. If the temperature uniformity of the to-be-heated member satisfies the requirement, step S4 is executed; and if the temperature uniformity of the to-be-heated member does not satisfy the requirement, step S5 is executed. Specifically, if the real-time temperature Tmeas☐[Tp−5° C., Tp+5° C.], the real-time temperature Tmeas is considered to be close to the preset target temperature Tp.

At step S4, the current weighting coefficients are determined to be the weighting coefficients needed by the process.

At step S5, k1 and k2 are adjusted based on the real-time temperatures detected at the intermediate area Z2 and the marginal area Z3 with reference to the area (here, the central area Z1) where the real-time temperature is close to the preset target temperature Tp. Specifically, whether the real-time temperature of the marginal area Z3 is higher than the real-time temperature of the central area Z1 is determined. If the real-time temperature of the marginal area Z3 is higher than the real-time temperature of the central area Z1, k1 is decreased and the decreased weighting coefficient is used as a current weighting coefficient k1. If the real-time temperature of the marginal area Z3 is not higher than the real-time temperature of the central area Z1, k1 is increased and the increased weighting coefficient is used as the current weighting coefficient k1. Meanwhile, whether the real-time temperature of the intermediate area Z2 is higher than the real-time temperature of the central area Z1 is determined. If the real-time temperature of the intermediate area Z2 is higher than the real-time temperature of the central area Z1, k2 is decreased and the decreased weighting coefficient is used as the current weighting coefficient k2. If the real-time temperature of the intermediate area Z2 is not higher than the real-time temperature of the central area Z1, k2 is increased and the increased weighting coefficient is used as the current weighting coefficient k2.

At step S6, each of the heating groups stops heating, and after the temperature of the to-be-heated member is decreased to room temperature, step S2 is executed.

In the above-described step S1, preferably, the initial value of the weighting coefficient kn is 1. As such, each of the heating groups may achieve a rated power output to guarantee the heating rate and reduce the processing time, thereby improving the process efficiency. Obviously, the present disclosure is not limited thereto, and in the practical applications, the initial values of the heating weighting function may be set to be other values based on the actual situations.

It should be noted that, in one embodiment, the heating weighting function is a piecewise function. However, the present disclosure is not limited thereto, and in practical applications, the heating weighting function may be Un=fn (U). As such, the temperature uniformity requirement on the to-be-heated member may be satisfied.

It should also be noted that, in one embodiment, Un is a linear function. However, the present disclosure is not limited thereto, and in actual applications, Un may be a nonlinear function such as a quadratic function, for example, $Un = k1n \cdot U^2 + k2n \cdot U + b$.

Figure 5A:
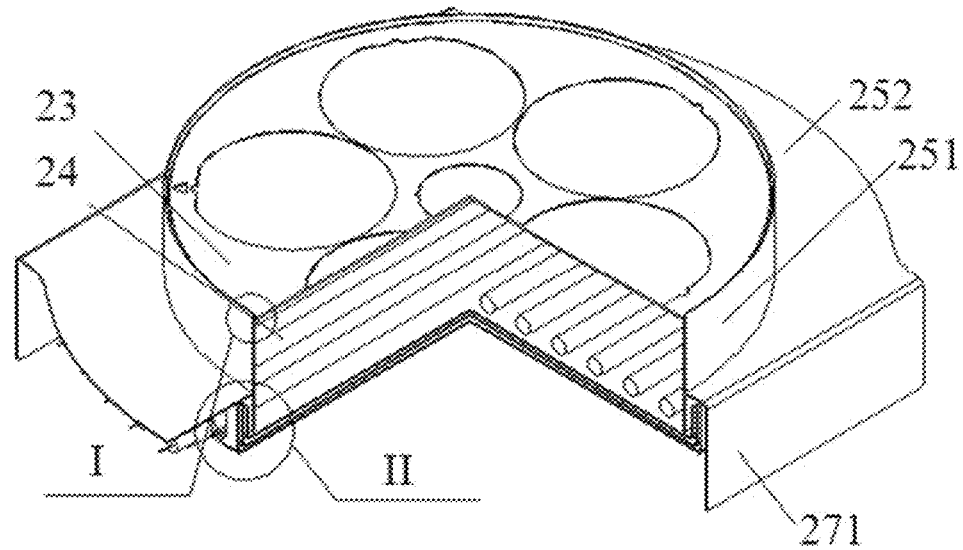
FIG. 5A is a structural schematic diagram of a thermal radiation shielding assembly used in embodiments of the present disclosure.
Figure 5B:
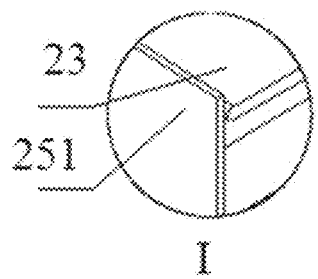
FIG. 5B is an enlarged view of region I in FIG. 5A.
Figure 5C:
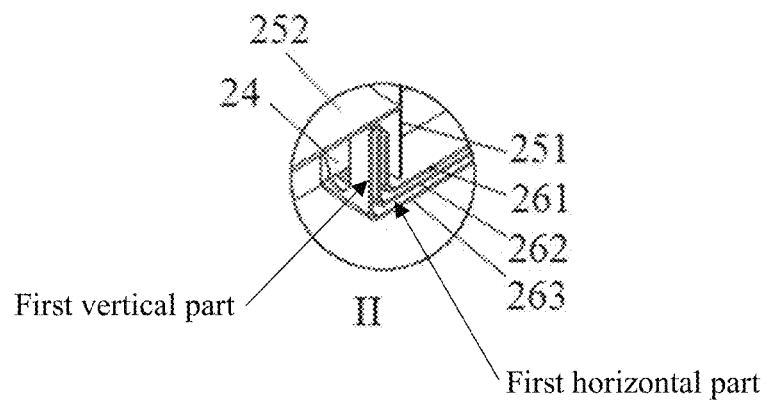
FIG. 5C is an enlarged view of region II in FIG. 5A.

The thermal radiation shielding assembly is configured to shield the heat radiated by the heating light tubes 24 towards the surroundings and the bottom thereof. Specifically, referring to FIGS. 5A-5C, in one embodiment, the thermal radiation shielding assembly includes first shielding members and a second shielding member. The number of the first shielding members may be three, and the first shielding members include the first shielding member 261, the first shielding member 262 and the first shielding member 263. Each first shielding member includes a first horizontal part and a first vertical part, where the first horizontal part is located below the heating light tubes 24 and covers the effective heating area 244, and the first vertical part is connected to the first horizontal part and surrounds the heating section 241 of the heating light tubes 24 (i.e., the effective heating area 244). Further, the top end of the first vertical part is higher than the heating light tubes 24, as shown in FIG. 5C. Further, the first vertical parts of the first shielding members are arranged at intervals along a direction parallel to the bearing surface, and the first horizontal parts of the first shielding members are arranged at intervals along a direction perpendicular to the bearing surface. By virtue of the three aforementioned first shielding members, the heating light tubes 24 may be prevented from directly affecting the components other than the to-be-heated member 23 in the chamber. Further, the larger the number of the first shielding members, the more the shielded radiation heat. This is because in the vacuum, the conduction of heat is mainly thermal radiation. The temperature of the heating wire in the heating light tube 24 is assumed to be T0, and the infrared short-wave generated by the heating wire directly radiates the first shielding member 261. The first shielding member 261 absorbs the radiated heat to raise the temperature to T1, and simultaneously sends the radiated heat to the first shielding member 262. Similarly, the first shielding member 262 absorbs the radiated heat and the temperature rises to T2, and the first shielding member 263 absorbs the radiated heat and the temperature rises to T3. When the first shielding member 263 sends the radiated heat to the base plate 21, the base plate 21 absorbs the radiated heat and the temperature rises to T4. According to thermal radiation law, a gradient variation in temperature exists from inside to outside of the three first shielding members serving as reflection shields, namely, T0>T1>T2>T3>T4. Thus, the heat radiated from the heating light tubes 24 to the base plate 21 and other components in the chamber may be reduced, thereby effectively preventing the temperatures of these components from being too high. In practical applications, the number of the first shielding members is not limited to be three, and may be configured to be one, two, or four or more, according to specific situations.

The second shielding member includes a second horizontal part 252 and a second vertical part 251, where the second vertical part 251 surrounds the bearing surface and the top end of the second vertical part 251 is higher than the bearing surface. The second horizontal part 252 surrounds an outer side of the second vertical part 251, and a plane where the second horizontal part 252 is located is higher than the first vertical parts and the heating light tubes 24. In one embodiment, the second vertical part 251 is located at an inner side of the innermost first vertical part. Obviously, in practical applications, the second vertical part 251 may be located at an outer side of the outermost first vertical part, or may be located between any two adjacent first vertical parts.

By virtue of the second shielding member, the heat radiated by the heating light tubes 24 to the surroundings may be effectively prevented. From the aforementioned descriptions, under the combined effects of the first shielding members and the second shielding member, the heating light tubes 24 may be prevented from directly affecting components other than the to-be-heated member 23 in the chamber, thereby preventing the temperatures of such components from being too high. In practical applications, surfaces of the first horizontal parts, the first vertical parts, the second horizontal part 252 and the second vertical part 251 facing towards the heating light tubes 24 may include a planar surface or a curved surface based on specific situations. Further, the materials of the first shielding members and the second shielding member may include a material of high temperature resistance, small deformation, and less outgassing at a high temperature, such as molybdenum, stainless steel or quartz. Further, preferably, the surfaces of the first horizontal parts, the first vertical parts, the second horizontal part 252 and the second vertical part 251 facing towards the heating light tubes 24 may be polished or plated to improve the light reflectivity.

In one embodiment, the heating device further includes two electrodes 281 and two electric connectors 282. The two electrodes 281 are disposed on the base plate 21 close to the central position of the base plate 21. The upper and lower ends of the electrode 281 are located above and below the base plate 21, respectively. The two electric connectors 282 are located between the lowermost first horizontal part and the base plate 21, one ends of the electric connectors 282 are respectively and electrically connected to the electrodes 281, and the other ends of the electric connectors 282 are electrically connected to the heating light tubes 24 through conductive wires (not shown in the figures).

Preferably, to prevent the electric field interferences of the connecting portions between the electric connectors 282 and the heating light tubes and the electric field interferences of the connecting portions between the electrodes 281 and the electric connectors 282 on other components, the heating device further includes a first electric shielding member 271 and a second electric shielding member 272. The first electric shielding member 271 is of a circular shape, is surroundingly located on the base plate 21, and has a first closed space to shield the electric fields generated at the connecting portions between the electric connectors 282 and the heating light tubes 24. The second electric shielding member 272 covers the connecting portions between the electrodes 281 and the electric connectors 282 to form a second closed space, and is configured to respectively shield the electric fields generated at the two electrodes 281 and the electric fields generated at the connecting portions between the two electrodes 281 and the electric connectors 282.

Preferably, a cooling channel (not shown in figures) is disposed in the base plate 21 to decrease the temperature of the base plate 21, and the base plate 21 may be cooled by introducing cooling water into the cooling channel through a cooling water pipe 31.

Figure 6:
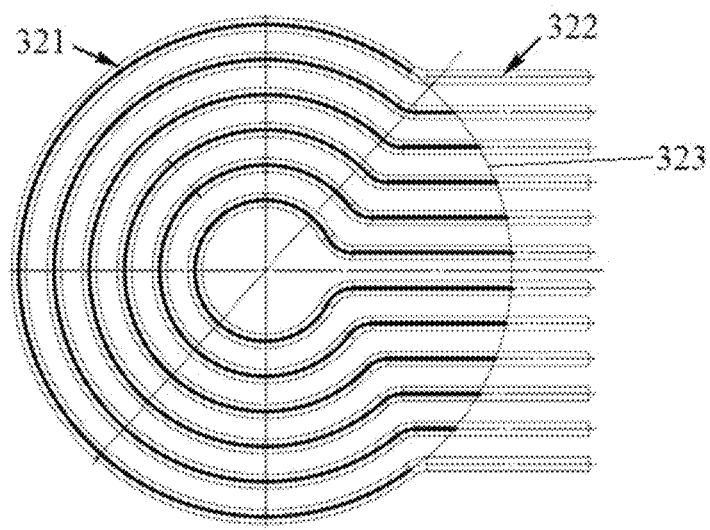
FIG. 6 is an arrangement diagram of heating light tubes used in a modified embodiment according to embodiments of the present disclosure.

As a modified embodiment of the above embodiments, FIG. 6 is an arrangement diagram of heating light tubes used in a modified embodiment according to embodiments of the present disclosure. Referring to FIG. 6, the only difference between the modified embodiment and the above-described embodiments lies in that the arrangements of the heating light tubes are different.

Specifically, in one embodiment, each of the heating light tubes includes an arc-shaped portion 321, and straight-line portions 322 connected to two ends of the arc-shaped portion 321, where the arc-shaped portions 321 of the heating light tubes are concentric, have different radii, and are arranged at equal intervals, and the straight-line portions of the heating light tubes are arranged in parallel to each other at equal intervals. The heating wires of the heating light tubes simultaneously form an effective heating area 323, and the effective heating area 323 may heat the to-be-heated member uniformly.

It should be noted that, in each aforementioned embodiment, the number of the heating light tubes is plural, but the present disclosure is not limited thereto. In practical applications, the number of the heating light tube may be one, and an effective heating area may be formed by winding the one heating light tube uniformly into a certain shape. For example, the heating light tube may be a planar spiral tube having equal space, thereby heating the to-be-heated member uniformly.

Figure 7:
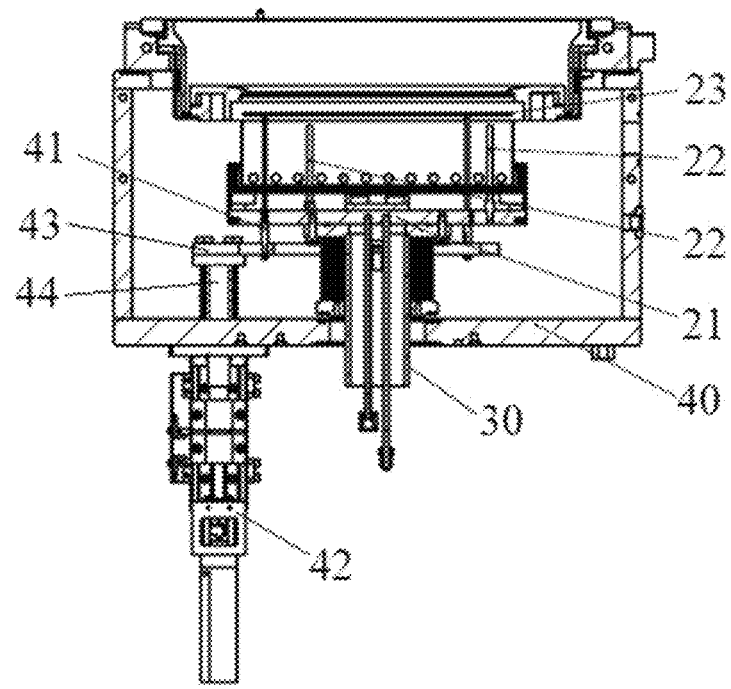
FIG. 7 is a cross-sectional view of a heating chamber according to embodiments of the present disclosure.

As another technical solution, embodiments of the present disclosure provide a heating chamber. FIG. 7 is a cross-sectional view of a heating chamber provided by embodiments of the present disclosure. Referring to FIGS. 3 and 7, a heating chamber 40 includes a heating device and a driving device for driving the heating device to move up and down. The heating device is disposed inside the heating chamber 40, and may be a heating device provided by any aforementioned embodiments.

In one embodiment, the driving device includes a first lifting shaft 30, a first driving mechanism (not shown in the figures), at least three movable supporting columns 41, a connector 43, a second lifting shaft 44, and a second driving mechanism 42. The first lifting shaft 30 is vertically arranged, an upper end of the first lifting shaft 30 is connected to the base plate 21, and a lower end of the first lifting shaft 30 extends vertically to be outside of the heating chamber. The first driving mechanism is disposed at the bottom of the heating chamber 40 and is connected to the first lifting shaft 30, and is configured to drive the base plate 21 to move up or down through the first lifting shaft 30, thereby driving the supporting columns 22 to move up or down. Further, fetching and placing operations of the to-be-heated member 23 may be realized.

The at least three movable supporting columns 41 are vertically arranged on the connector 43 and are distributed along a circumferential direction of the base plate 21 at intervals. The top ends of the at least three movable supporting columns 41 are used for supporting the to-be-heated member 23. The second lifting shaft 44 is configured vertically, and has an upper end connected to the connector 43 and a lower end vertically extending to the outside of the heating chamber 40. The second driving mechanism 42 is disposed at the bottom of the heating chamber 40 and is connected to the second lifting shaft 44, and is configured to drive the at least three movable supporting columns 41 to synchronously move up or down through the second lifting shaft 44. When transferred into the heating chamber 40, the to-be-heated member 23 is placed on the movable supporting columns 41 first. Further, driven by the second driving mechanism 42, the movable supporting columns 41 move down to a position lower than the top ends of the supporting columns 22. During such process, the to-be-heated member 23 is transferred from the movable supporting columns 41 to the supporting columns 22, and by then, the to-be-heated member 23 starts to be heated.

Obviously, in practical applications, only the aforementioned first lifting shaft 30 and the first driving mechanism may be used to drive the base plate 21 to move up or down, thereby implementing the fetching and placing operations of the to-be-heated member 23. Under such situation, a passage needs to be configured at a corresponding position of the thermal radiation shielding assembly to allow a robot arm for transferring the to-be-heated member 23 to pass through, thereby realizing the fetching and placing operations of the substrate.

Further, to ensure the vacuum degree of the chamber, the heating chamber 40 further includes a corrugated pipe assembly, and the corrugated pipe assembly includes an upper flange 293, a lower flange 295, and a corrugated pipe 294. The upper flange 293 is fixed onto the bottom of the base plate 21 via a fastening screw 291, and is sleeved on the top end of the first lifting shaft 30. Further, the electrodes 281 are located in a central hole of the upper flange 293 and a hollow space of the first lifting shaft 30. Further, a sealing member 292 is disposed between the upper flange 293 and the base plate 21 to seal a gap therebetween. The lower flange 295 is sleeved on the first lifting shaft 30 and is tightly connected thereto. The corrugated pipe 294 is sleeved on the first lifting shaft 30, and is located between the upper flange 293 and the lower flange 295.

By using the aforementioned heating device, the heating chamber provided by the present disclosure may not only be applied to a vacuum environment and an atmospheric environment, but may also improve the heating efficiency and the heating uniformity.

The foregoing embodiments merely represent several implementations of the present disclosure. The descriptions of such embodiments are relatively fully and detailed, but shall not be understood as limitations of the protection scope of the present disclosure. It should be understood that, for those ordinarily skilled in the relevant art, various modifications and improvements may be made without departing from the concept of the present disclosure, and these modifications and improvements shall all fall within the protection scope of the present disclosure.

What is claimed is:

1. A heating device, comprising a base plate, at least three supporting columns, a heating assembly, and a heating control system, wherein:
    the at least three supporting columns are arranged vertically on the base plate and are distributed at intervals along a circumferential direction of the base plate, and top ends of the at least three supporting columns form a bearing surface for supporting a to-be-heated member;
    the heating assembly comprises a plurality of heating light tubes and a thermal radiation shielding housing, wherein:
        the heating light tubes are divided into a plurality of heating groups based on different areas of the bearing surface, heating light tubes in a same heating group are electrically connected with each other, and heating light tubes in different heating groups are shielded from each other,
        the heating light tubes are disposed above the base plate and below the bearing surface and are configured to radiate heat towards the bearing surface, and a projection of an effective heating area formed by uniform distribution of the heating light tubes on the base plate covers a projection of the bearing surface on the base plate, and
        the thermal radiation shielding housing is arranged at surroundings and a bottom of the heating light tubes to shield heat radiated by the heating light tubes; and
    the heating control system comprises a temperature detector, a temperature controller, an adjustment controller, and a plurality of power controllers,
    wherein:
        the temperature detector is configured to detect a real-time temperature at any position of the to-be-heated member in an execution stage of a heating process and send the real-time temperature to the temperature controller,
        the temperature controller is configured to generate a control signal based on the real-time temperature sent from the temperature detector and a preset target temperature and send the control signal to the adjustment controller,
        the adjustment controller is configured to respectively obtain a plurality of control sub-signals corresponding to the heating groups based on the control signal and a heating weighting function and send the plurality of control sub-signals to the plurality of power controllers in a one-to-one correspondence, and
        a number of the power controllers corresponds to a number of the heating groups, and each power controller is configured to adjust heating power of the heating light tubes in a corresponding heating group based on the plurality of control sub-signals.

2. The heating device according to claim 1, wherein each of the heating light tubes comprises a heating section and two non-heating sections located at two ends of the heating section, wherein:
    a heating wire for generating heat is disposed in the heating section that corresponds to the effective heating area; and
    wires respectively connected to two ends of the heating wire are disposed in each non-heating section and configured as an anode and a cathode of the heating light tube.

3. The heating device according to claim 2, wherein, with respect to each of the heating light tubes, a shape and a size of a respective effective heating area are obtained by configuring a shape of the heating light tube and a length of the heating wire.

4. The heating device according to claim 2, wherein;
    the heating light tubes are straight tubes, and are arranged in parallel to each other at equal intervals; or
    each of the heating light tubes comprises an arc-shaped portion and straight-line portions connected to two ends of the arc-shaped portion, wherein the arc-shaped portions of the heating light tubes are concentric, have different radii, and are arranged at equal intervals; and the straight-line portions of the heating light tubes are arranged in parallel to each other at equal intervals.

5. The heating device according to claim 2, wherein the thermal radiation shielding housing comprises:
    at least one first shielding member comprising a first horizontal part and a first vertical part, wherein the first horizontal part is located below the heating light tubes and covers the effective heating area; the first vertical part is connected to the first horizontal part and surrounds the heating section of the heating light tubes, and a top end of the first vertical part is higher than the heating light tubes; and
    at least one second shielding member comprising a second horizontal part and a second vertical part, wherein the second vertical part surrounds the bearing surface and a top end of the second vertical part is higher than the bearing surface, the second horizontal part surrounds an outer side of the second vertical part, and a plane where the second horizontal part is located is higher than the first vertical part and the heating light tubes.

6. The heating device according to claim 5, wherein a number of the a least one first shielding members is plural, and the first vertical parts of the plurality of first shielding members are arranged at intervals along a direction parallel to the bearing surface; and the first horizontal parts of the plurality of first shielding members are arranged at intervals along a direction perpendicular to the bearing surface.

7. The heating device according to claim 5, wherein surfaces of the first horizontal part, the first vertical part, the second horizontal part and the second vertical part that faces towards the heating light tubes are respectively polished or plated to improve light reflectivity.

8. The heating device according to claim 1, wherein a shape of the effective heating area corresponds to a shape of the bearing surface.

9. The heating device according to claim 1, wherein the heating weighting function is established in a preset stage by a method of trial and error based on a temperature distribution condition of the to-be-heated member.

10. The heating device according to claim 9, wherein in the preset stage, in a process of establishing the heating weighting function, temperature detection points are configured in areas of the bearing surface where the heating groups are located in a one-to-one correspondence; and in a detection process, the real-time temperatures of the temperature detection points are detected; when a real-time temperature detected at any one of the temperature detection points is close to the preset target temperature, the temperature distribution condition of the to-be-heated member is obtained based on the real-time temperatures of the temperature detection points detected at a current moment, and the heating weighting function is established based on the temperature distribution condition, thereby allowing a temperature difference between different areas of the to-be-heated member to satisfy a requirement of a process on temperature uniformity.

11. The heating device according to claim 1, wherein the heating weighting function is:

when $Tmeas < Tp-T, Un=U;$ when $Tmeas \geq Tp-T, Un=fn(U)=knU+b;$ wherein n is an integer greater than 0 and less than or equal to N, and N is the number of the heating groups;
Tmeas is the real-time temperature detected by the temperature detector;
Un represents a control sub-signal corresponding to an $n^{th}$ heating group;
U represents the control signal;
fn (U) represents a preset correspondence rule corresponding to the $n^{th}$ heating group;
Tp is the preset target temperature;
T is a preset threshold temperature;
kn is a weighting coefficient corresponding to the $n^{th}$ heating group; and
b is a constant.

12. The heating device according to claim 1, wherein one of the at least three supporting columns is configured as a thermocouple of the temperature detector.

13. The heating device according to claim 1, wherein the heating device further comprises:
two electrodes disposed on the base plate at a position close to a central position of the base plate; wherein upper and lower ends of each electrode are located above and below the base plate, respectively; and
two electric connectors located between the thermal radiation shielding housing and the base plate, wherein one ends of the electric connectors are respectively connected to the electrodes, and the other ends of the electric connectors are electrically connected to the heating light tubes.

14. The heating device according to claim 13, wherein the heating device further comprises:
a first electric shielding member surrounding the base plate, and having a first closed space to shield electric fields generated at connecting portion between the electric connectors and the light heating tubes; and
a second electric shielding member covering connecting portions between the electrodes and the electric connectors to form a second closed space to respectively shield electric fields generated at the connecting portions between the electrodes and the electric connectors.

15. A heating chamber, comprising a heating device and a driving device for driving the heating device to move up and down, wherein:
the heating device comprises a base plate, at least three supporting columns, a heating assembly, and a heating control system, wherein:
the at least three supporting columns are arranged vertically on the base plate and are distributed at intervals along a circumferential direction of the base plate, and top ends of the at least three supporting columns form a bearing surface for supporting a to-be-heated member;
the heating assembly comprises a plurality of heating light tubes and a thermal radiation shielding housing, wherein:
the heating light tubes are divided into a plurality of heating groups based on different areas of the bearing surface, heating light tubes in a same heating group are electrically connected with each other, and heating light tubes in different heating groups are shielded from each other,
the heating light tubes are disposed above the base plate and below the bearing surface and are configured to radiate heat towards the bearing surface, and a projection of an effective heating area formed by uniform distribution of the heating light tubes on the base plate covers a projection of the bearing surface on the base plate, and
the thermal radiation shielding housing is arranged at surroundings and a bottom of the heating light tubes to shield heat radiated by the heating light tubes; and
the heating control system comprises a temperature detector, a temperature controller, an adjustment controller, and a plurality of power controllers, wherein:
the temperature detector is configured to detect a real-time temperature at any position of the to-be-heated member in an execution stage of a heating process and send the real-time temperature to the temperature controller,
the temperature controller is configured to generate a control signal based on the real-time temperature sent from the temperature detector and a preset target temperature and send the control signal to the adjustment controller, the adjustment controller is configured to respectively obtain a plurality of control sub-signals corresponding to the heating groups based on the control signal and a heating weighting function and send the plurality of control sub-signals to the plurality of power controllers in a one-to-one correspondence, and a number of the power controllers corresponds to a number of the heating groups, and each power controller is configured to adjust heating power of the heating light tubes in a corresponding heating group based on the plurality of control sub-signals.

16. The heating chamber according to claim 15, wherein the driving device comprises a first lifting shaft and a first driving mechanism, wherein:

the first lifting shaft is configured vertically, an upper end of the first lifting shaft is connected to the base plate, and a lower end of the first lifting shaft extends vertically to an outside of the heating chamber; and the first driving mechanism is disposed at a bottom of the heating chamber and connected to the first lifting shaft, and is configured to drive the base plate to move up or down through the first lifting shaft.

17. The heating chamber according to claim 16, wherein the driving device further comprises at least three movable supporting columns, a connector, a second lifting shaft and a second driving mechanism, wherein:

the at least three movable supporting columns are configured vertically on the connector and are distributed along a circumferential direction of the base plate at intervals, and top ends of the at least three movable supporting columns are configured to support the to-be-heated member;

the second lifting shaft is configured vertically, an upper end of the second lifting shaft is connected to the connector, and a lower end of the second lifting shaft extends vertically to the outside of the heating chamber; and the second driving mechanism is configured at the bottom of the heating chamber and connected to the second lifting shaft, and is configured to drive the movable supporting columns to move up or down through the second lifting shaft.

18. A heating device, comprising a base plate, at least three supporting columns, a heating assembly, two electrodes, and two electric connectors, wherein:

the at least three supporting columns are arranged vertically on the base plate and are distributed at intervals along a circumferential direction of the base plate, and top ends of the at least three supporting columns form a bearing surface for supporting a to-be-heated member;

the heating assembly comprises at lease one heating light tube and a thermal radiation shielding housing, wherein:

the at least one heating light tube is disposed above the base plate and below the bearing surface and is configured to radiate heat towards the bearing surface, and a projection of an effective heating area formed by uniform distribution of the at least one heating light tube on the base plate covers a projection of the bearing surface on the base plate, and the thermal radiation shielding housing is configured to shield heat radiated by the at least one heating light tube towards surroundings and a bottom of the at least one heating light tube;

the two electrodes are disposed on the base plate at a position close to a central position of the base plate, upper and lower ends of each electrode being located above and below the base plate, respectively; and the two electric connectors are located between the thermal radiation shielding housing and the base plate, one ends of the electric connectors being respectively connected to the electrodes, and the other ends of the electric connectors being electrically connected to the at least one heating light tube.

* * * * *